(12) United States Patent
Choo et al.

(10) Patent No.: US 6,423,973 B2
(45) Date of Patent: Jul. 23, 2002

(54) X-RAY IMAGE SENSOR AND METHOD FOR FABRICATING THE SAME

(75) Inventors: Kyo-Seop Choo, Seoul; June-Ho Park, Kyoungsangbuk-do, both of (KR)

(73) Assignee: LG. Philips LCD Co., Ltd., Seoul (KR)

( * ) Notice: Subject to any disclaimer, the term of this patent is extended or adjusted under 35 U.S.C. 154(b) by 34 days.

(21) Appl. No.: 09/750,244

(22) Filed: Dec. 29, 2000

(30) Foreign Application Priority Data

Dec. 31, 1999 (KR) ............................................. 99-67854

(51) Int. Cl.[7] ......................... G01T 1/24; H01L 21/331
(52) U.S. Cl. ..................................... 250/370.09; 438/96
(58) Field of Search ......................... 250/370.09; 438/96

(56) References Cited

U.S. PATENT DOCUMENTS

| | | | |
|---|---|---|---|
| 5,478,766 A | * | 12/1995 | Park et al. ......... 148/DIG. 105 |
| 5,516,712 A | * | 5/1996 | Wei et al. ................... 438/155 |
| 5,598,004 A | * | 1/1997 | Powell et al. .......... 250/370.09 |
| 5,652,130 A | * | 7/1997 | Kriegler et al. ............ 424/93.2 |
| 5,784,131 A | * | 7/1998 | Kim et al. .................. 349/187 |
| 6,060,714 A | * | 5/2000 | Zhong et al. ............ 250/214.1 |
| 6,088,071 A | * | 7/2000 | Yamamoto et al. ........... 349/38 |

\* cited by examiner

Primary Examiner—Constantine Hannaher
(74) Attorney, Agent, or Firm—McKenna Long & Aldridge LLP (57) ABSTRACT

An X-ray image sensor fabricated using eight-mask steps. A thin film transistor (TFT) having a gate electrode, a first insulation layer, pure and doped amorphous silicon layers, and source and drain electrodes is on a substrate. An island-shaped first insulation layer, semiconductor layer, and ground line are also formed. A second insulation layer having a first drain contact hole and a ground line contact hole covers the TFT, the substrate, and the ground line. An auxiliary drain electrode on the second insulation layer contacts the drain electrode through the first drain contact hole. A capacitor electrode on the second insulation layer contacts the ground line through the ground line contact hole. A third insulation layer having a second drain contact hole that exposes the auxiliary drain is on the second insulation layer, the auxiliary drain electrode, and the capacitor electrode. A pixel electrode on the third insulation layer contacts the auxiliary drain electrode through the second drain contact hole.

10 Claims, 5 Drawing Sheets

X-RAY IMAGE SENSOR AND METHOD FOR FABRICATING THE SAME

This application claims the benefit of Korean Patent Application No. 1999-67854, filed on Dec. 31, 1999, which is hereby incorporated by reference for all purposes as if fully set forth herein.

BACKGROUND OF THE INVENTION

1. Field of the Invention

The present invention relates to X-ray image sensors. More particularly, it relates to X-ray image sensors having a TFT (Thin Film Transistor) array, and to a method for fabricating the same.

2. Discussion of the Related Art

X-ray detection has been widely used for medical diagnosis. X-ray detection typically uses an X-ray film to produce a photograph. Therefore, some predetermined developing and printing procedures are required to produce the photograph.

However, digital X-ray image sensors that employ TFTs (Thin Film Transistors) have been developed. Such X-ray image sensors have the advantage that a real time diagnosis can be obtained.

Figure 1:
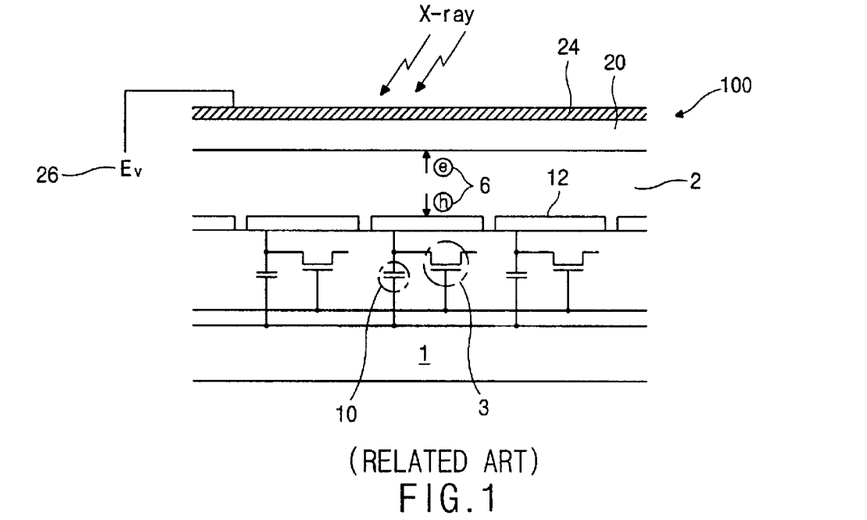
FIG. 1 is a cross-sectional view illustrating the principle of operation of an X-ray image sensor.

FIG. 1 is a schematic, cross-sectional view illustrating the structure and operation of an X-ray image sensing device 100. Included are a lower substrate 1, a thin film transistor 3, a storage capacitor 10, a pixel electrode 12, a photoconductive film 2, a protection film 20, a conductive electrode 24 and a high voltage D.C. (direct current) power supply 26.

The photoconductive film 2 produces electron-hole pairs 6 in proportion to the strength of external signals (such as incident electromagnetic waves or magnetic waves). That is, the photoconductive film 2 acts as a converter that converts external signals, particularly X-rays, into electric signals. Either the electrons or the holes are then gathered by the pixel electrode 12 as electric charges. The pixel electrode 12 is located beneath the photoconductive film 2. Which electric charges that is gathered depends on the voltage (Ev) polarity that is applied to the conductive electrode 24 by the high voltage D.C. power supply 26. The gathered electric charges accumulate in the storage capacitor 10, which is formed in connection with a grounding line. Charges in the storage capacitor 10 are then selectively transferred through the TFT 3, which is controlled externally, to an external image display device that forms an X-ray image.

In such an X-ray image sensing device, to detect and convert weak X-ray signals into electric charges it is beneficial to decrease the trap state density (for the electric charge) in the photoconductive film 2, and to decrease charge flow in non-vertical directions. Decreasing non-vertical charge flow is usually accomplished by applying a relatively high voltage between the conductive electrode 24 and the pixel electrode 12.

Electric charges in the photoconductive film 2 are trapped and gathered not only on the pixel electrode 12, but also over the channel region of the TFT 3. Even during the OFF state, the electric charges trapped and gathered on the pixel electrode 12 and on the channel region of the TFT 3 induce a potential difference between the TFT 3 and the pixel electrode. This has a similar effect as the TFT 3 being in the ON state. This adversely affects the switching of the TFT 3 and increases the OFF state leakage current. Such can result in an undesired image.

Figure 2:
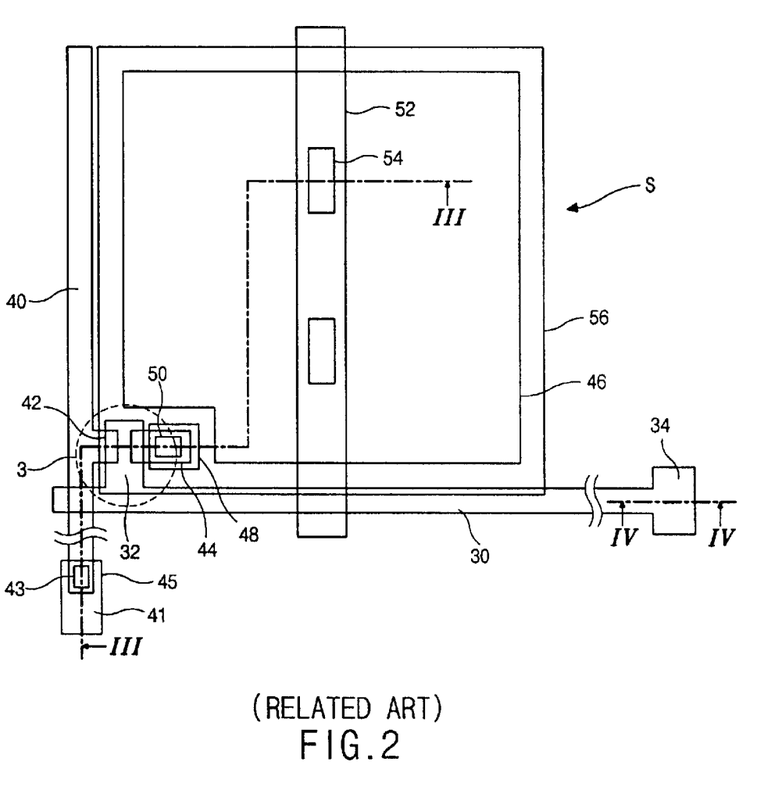
FIG. 2 is a plan view illustrating one pixel of an X-ray image sensor according to a conventional art.

FIG. 2 is a plan view illustrating a pixel of the X-ray image sensor panel. Shown are the TFT 3, a storage capacitor "S" and gate and data lines 30 and 40.

The gate line 30 is arranged in one direction and the data line 40 is arranged perpendicular to the gate line 30. The TFT 3 is formed near the crossing of the gate and data lines 30 and 40. The TFT 3 includes a gate electrode 32, which is formed by an elongation of the gate line 30, and a source electrode 42, which is formed by an elongation of a data line 40. The TFT 3 also includes a drain electrode 44 that is spaced apart from the source electrode 42.

A ground line 52 is parallel to the data line 40 and perpendicular to the gate line 30. The ground line 52 crosses the storage capacitor area and acts as a common electrode that is shared by adjacent pixels. A ground line contact hole 54 is formed over the ground line 52 such that a capacitor electrode 46 contacts the ground line 52 through the ground line contact hole 54. Two or more two ground line contact holes can be formed over the ground line 52.

The storage capacitor "S", which stores the electric charges, is comprised of the capacitor electrode 46, a pixel electrode 56, and a dielectric layer (not shown) that is interposed between the capacitor electrode 46 and the pixel electrode 56. The pixel electrode 56 extends over the TFT 3 and acts as the other capacitor electrode. In order to couple the electrons (which come from the TFT "3") with the holes (which are stored in the storage capacitor "S"), the pixel electrode 56 is electrically connected to the drain electrode 44 via a drain contact hole 50 and via an auxiliary drain electrode 48.

A gate pad 34 is formed at one end of the gate line 30, and a data pad 41 is formed at one end of the data line 40. The data pad 41 includes a data pad connector 45 that contacts the data line 40 through the first data pad contact hole 43. Thus, the data line 40 is electrically connected to the data pad 41.

The principle and the function of the X-ray image sensing device will now be explained.

The holes (electric charges) generated in a photoconductive film (not shown) are accumulated on the pixel electrode 56 and stored in the storage capacitor "S" with the capacitor electrode 46.

The holes in the storage capacitor "S" are transferred to the source electrode 42 through the drain electrode 44 when the TFT 3 is turned ON. The holes arrive at an external image display device that forms an X-ray image. At this time, the ground line 52 removes the residual charges (holes) that are not transferred to the external image display device, i.e., that remain in the storage capacitor "S". Of course, the foregoing discussion of holes is to be taken in an engineering context as holes are not physical currents.

FIGS. 3A to 3E are cross-sectional views, taken along line III—III of FIG. 2, that illustrate manufacturing processes of an X-ray image sensor panel.

Figure 3A:
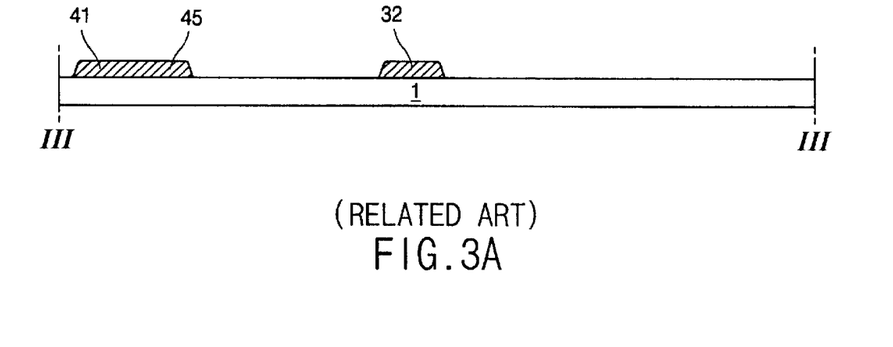
FIGS. 3A to 3E are processing diagrams corresponding to a cross-section of FIG. 2 along line (III—III) and sequentially illustrate the manufacture of an X-ray image sensor according to the conventional art.

Referring to FIG. 3A, a gate electrode 32, a data pad 41 and a data pad connector 45 are formed on a substrate 1 by depositing and patterning a low resistant metallic material such as Aluminum (Al) or Al-alloy (for example, AlNd) using a first mask. The substrate 1 is made of a glass substrate, which is mainly used when processing is performed at a low temperature, or of a quartz glass, which has a high melting temperature and is more suitable for high temperature processing.

Figure 3B:
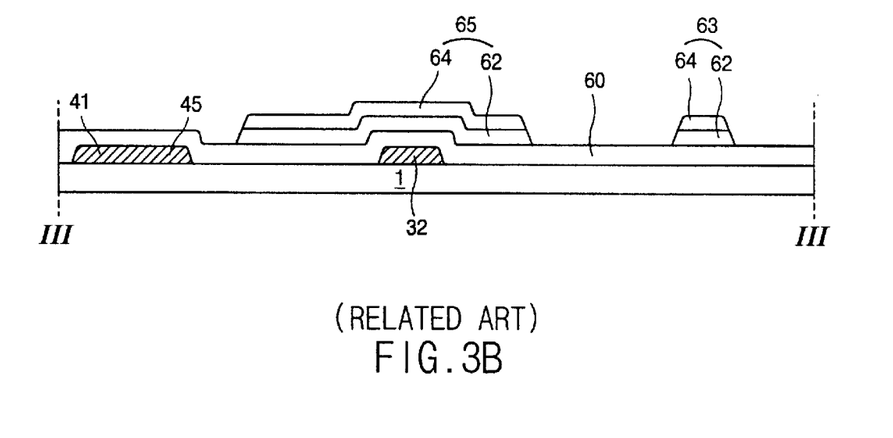

FIG. 3B illustrates a manufacturing step of forming a first insulation layer 60 and semiconductor layers 65 and 63. The first insulation layer 60 is formed at a thickness of about 4000 Å by depositing an inorganic insulation material such as Silicon Nitride ($SiN_x$) or Silicon Oxide ($SiO_x$). Silicon Nitride ($SiN_x$) is beneficially used in a related art.

After that, the semiconductor layers are formed by depositing a pure amorphous silicon 62 and a doped amorphous silicon 64 in sequence. The CVD (Chemical Vapor Deposition) or the Ion Injection Method are beneficially used to form the doped amorphous silicon layer 64. The CVD method is employed in a related art.

The semiconductor layer 65 and the island-shaped semiconductor layer 63 are formed by patterning the pure amorphous silicon and the doped amorphous silicon using a second mask. The island-shaped semiconductor layer 63 acts as an auxiliary electrode of a ground line that will be formed later.

Figure 3C:
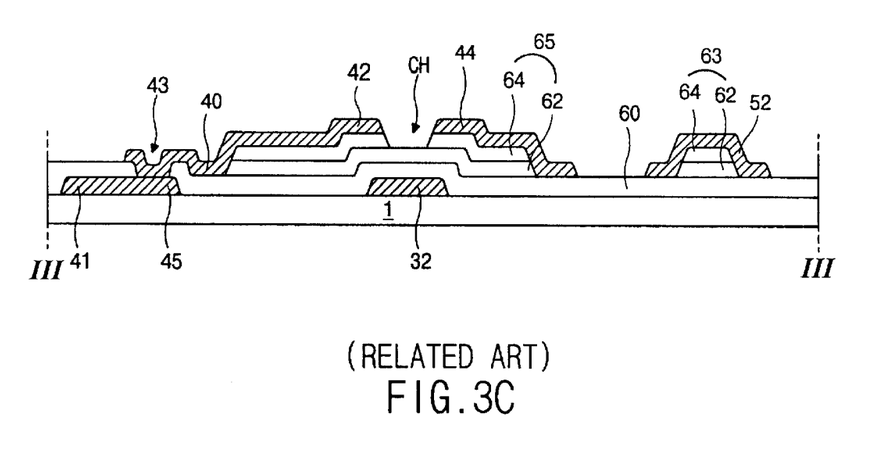

Referring to FIG. 3C, a first data pad contact hole 43 is formed over the data pad connector 45 by patterning the first insulation layer 60 using a third mask. Then, a data line 40, a source electrode 42, a drain electrode 44 and a ground line 52 are formed by depositing and patterning a second metal, such as Chrome (Ch) or a Cr-alloy, using a fourth mask. The data line 40 is formed such that it is electrically connected to the data pad 41 through the first data pad contact hole 43. A portion of the doped amorphous silicon layer 64 on the pure amorphous silicon layer 62 is then etched, using the source and drain electrodes 42 and 44 as masks, to form a channel region "CH". Thus, the TFT 3 (see FIG. 2) is completed.

Figure 3D:
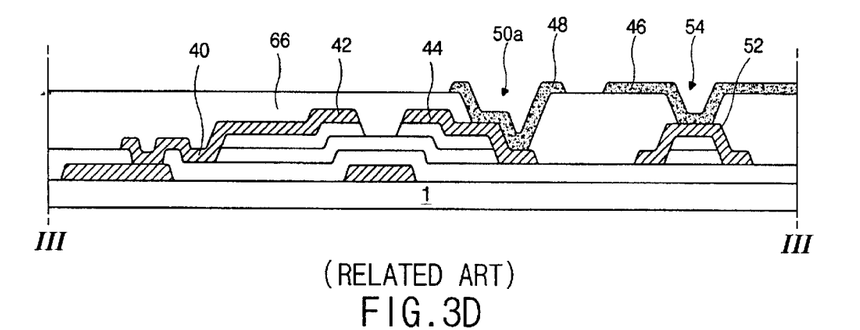

As shown in FIG. 3D, a second insulation layer 66 is formed over the TFT, over the ground line 52 and on the first insulation layer 60. A first drain contact hole 50a is then formed to expose a portion of the drain electrode 44, and a ground line contact hole 54 is formed to expose a portion of the ground line 52, by use of a fifth mask. After that, an auxiliary drain electrode 48 and a capacitor electrode 46 are formed by depositing and patterning a transparent conductive material using a sixth mask. The auxiliary drain electrode 48 contacts the drain electrode 44 via the first drain contact hole 50a, and the capacitor electrode 46 contacts the ground electrode 52 via the ground line contact hole 54. The auxiliary drain electrode 48 and the capacitor electrode 46 are spaced apart from each other.

Figure 3E:
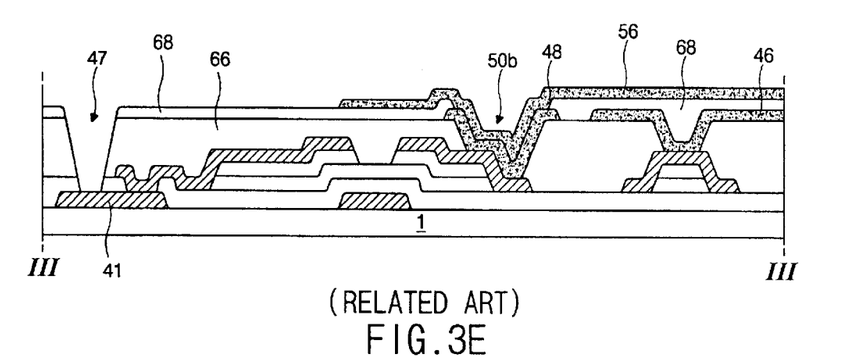

Referring to FIG. 3E, a third insulation layer 68 is formed on the second insulation layer 66, on the auxiliary drain electrode 48, and on the capacitor electrode 46. A second drain contact hole 50b is then formed to expose a portion of the auxiliary drain electrode 48 by patterning the third insulation layer 68 using a seventh mask. After that, a transparent conductive material is deposited and patterned to form a pixel electrode 56 using an eighth mask. The pixel electrode 56 is electrically connected to the auxiliary drain electrode 48.

Finally, a second data pad contact hole 47 is formed to expose the data pad 41 by patterning the first, second and third insulation layers 60, 66, and 68 using a ninth mask.

Therefore, as described above, the conventional X-ray image sensor is formed using a nine-mask process.

Although not depicted, the next step is the application of a photoconductive film. That material converts received external signals (X-rays) into electric charges. The photoconductive film is beneficially comprised of an amorphous selenium compound that is deposited with a thickness of 100 to 500 μm by an evaporator. However, other X-ray photoconductive films that having low dark conductivity and high sensitivity to external signals, for example $HgI_2$, $PbO_2$, CdTe, CdSe, Thallium bromide, or Cadmium sulfide can also be used. When the photoconductive film is exposed to X-rays, electron-hole pairs are produced in the photoconductive film in accordance with the strength of the x-rays.

After the application of the X-ray photoconductive film, a transparent conductive electrode that passes X-ray is formed. When a voltage is applied to the transparent conductive electrode while X-rays are being irradiated, electron-hole pairs formed in the photoconductive film are separated into charges that are gathered to the pixel electrode and stored in the storage capacitor "S" (see FIG. 2).

Figure 4:
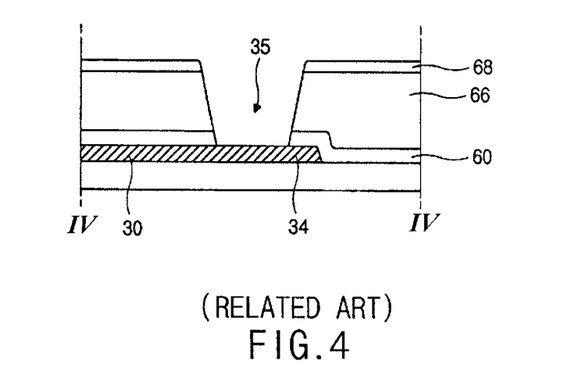
FIG. 4 is an cross-sectional view illustrating a gate pad taken along line IV—IV of FIG. 2.

FIG. 4, a cross-sectional view taken along line IV—IV, illustrates the gate pad 34 (see FIG. 2). The gate pad 34 is extended from the gate line 30, and the gate pad contact hole 35 is formed to expose a portion of the gate pad 34 by patterning the first, second and third insulation layers 60, 66, and 68.

As described above, nine mask processes are used to fabricate the X-ray image sensor. Each mask process requires several steps, such as a cleaning step, a depositing step, a baking step, and an etching step. Therefore, if the number of mask processes is decreased by only one mask, the throughput and manufacturing yields can dramatically increase and the manufacturing costs and time can be reduced.

SUMMARY OF THE INVENTION

Accordingly, the present invention is directed to an X-ray image sensor and to a method for fabricating the same and that substantially obviates one or more of the problems due to limitations and disadvantages of the related art.

An object of the present invention is to provide an X-ray image sensor having simpler processing steps while forming a first data contact hole, a semiconductor layer, and an island-shaped semiconductor layer.

Another object of the present invention is to provide an X-ray image sensor having improved yields.

A further object of the invention is to provide a method of forming an X-ray image sensor which can reduce processing error during production by reducing mis-alignment.

Additional features and advantages of the invention will be set forth in the description that follows, and in part will be apparent from the description, or may be learned by practice of the invention. The objectives and other advantages of the invention will be realized and attained by the structure particularly pointed out in the written description and claims hereof as well as the appended drawings.

To achieve the above objects, the present invention provides an X-ray image sensor, including: a substrate having a pixel region with a switching region at one corner of the pixel region; a thin film transistor (TFT) formed on the switching region of the substrate, the TFT having a gate electrode, a first insulation layer, a pure amorphous silicon layer, a doped amorphous silicon layer, and source and drain electrodes; an island-shaped first insulation layer and a island-shaped semiconductor layer formed over the substrate in the pixel region; a ground line formed on the island-shaped semiconductor layer; a second insulation layer formed on the TFT, on the substrate, and on the ground line, the second insulation layer having a first drain contact hole which exposes a portion of the drain electrode, and a ground line contact hole which exposes a portion of the ground line; an auxiliary drain electrode formed on the second insulation layer and contacting the drain electrode through the first drain contact hole; a capacitor electrode formed on the second insulation layer and contacting the ground line through the ground line contact hole; a third insulation layer formed on the second insulation layer, on the auxiliary drain electrode, and on the capacitor electrode, the third insulation layer having a second drain contact hole which exposes a portion of the auxiliary drain electrode; and a pixel electrode formed on the third insulation layer and contacting the auxiliary drain electrode through the second drain contact hole.

Beneficially, the pixel electrode extends over the source and drain electrodes.

Beneficially, the auxiliary drain electrode and the capacitor electrode are made of the transparent conductive material, and the second insulation layer is made of BCB (benzocyclobutene).

In order to achieve the above objects, the invention also provides a method for fabricating an X-ray image sensor, including: providing a substrate that has a pixel region having a switching region at one corner of the pixel region and portions defined for data and gate lines; forming a gate electrode, a data pad connector, and a data pad on the substrate by depositing and patterning a first metallic material using a first mask process; sequentially forming a first insulation layer, a pure amorphous silicon layer, and a doped amorphous silicon layer, the first insulation layer covering the substrate, the gate electrode, the data pad connector, and the data pad; forming a first data pad contact hole, a semiconductor layer, and an island-shaped semiconductor layer by patterning the doped amorphous silicon layer, the pure amorphous silicon layer, and the first insulation layer using a second mask process, the first data contact hole exposing a portion of the data pad connector; forming a data line, a source electrode, a drain electrode, and a ground line on the semiconductor layer and on the island-shaped semiconductor layer by depositing and patterning a second metallic material using a third mask process, the data line contacting the data pad connector through the first data pad contact hole; forming a second insulation layer on the TFT, on the substrate, and on the ground line; forming a first drain contact hole and a ground line contact hole by patterning the second insulation layer using a fourth mask process, the first drain contact hole exposing a portion of the drain electrode and the ground line contact hole exposing a portion of the ground line; forming an auxiliary drain electrode and a capacitor electrode on the second insulation layer by depositing and patterning a transparent conductive material using a fifth mask process, the auxiliary drain electrode contacting the drain electrode through the first drain contact hole and the capacitor electrode contacting the ground line through the ground line contact hole; forming a third insulation layer on the second insulation layer, on the auxiliary drain electrode, and on the capacitor electrode; forming a second drain contact hole to expose a portion of the auxiliary drain electrode by patterning the third insulation layer using a sixth mask process; forming a pixel electrode on the third insulation layer by depositing and patterning a transparent conductive material using a seventh mask process, the pixel electrode contacting the auxiliary drain electrode through the second drain contact hole; and forming a second data pad contact hole to expose the data pad by patterning the first, second and third insulation layers and the pure and doped amorphous silicon layers.

In order to achieve the above objects, the invention also provides a method for fabricating an X-ray image sensor, further including forming a channel region by removing a portion of the doped amorphous silicon layer over the pure amorphous silicon layer using the source and drain electrodes as masks after forming the source and drain electrodes.

Beneficially, the auxiliary drain electrode, the capacitor electrode, and the pixel electrode are formed from indium tin oxide (ITO) or from indium zinc oxide (IZO), and the gate electrode, the data pad connector, and the data pad are formed from a material selected from a group consisting of aluminum (Al) and aluminum-neodymium (AlNd).

It is to be understood that both the foregoing general description and the following detailed description are exemplary and explanatory and are intended to provide further explanation of the invention as claimed.

BRIEF DESCRIPTION OF THE DRAWING

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF PREFERRED EMBODIMENT

Reference will now be made in detail to an illustrated embodiment of the present invention, the example of which is shown in the accompanying drawings.

Figure 5:
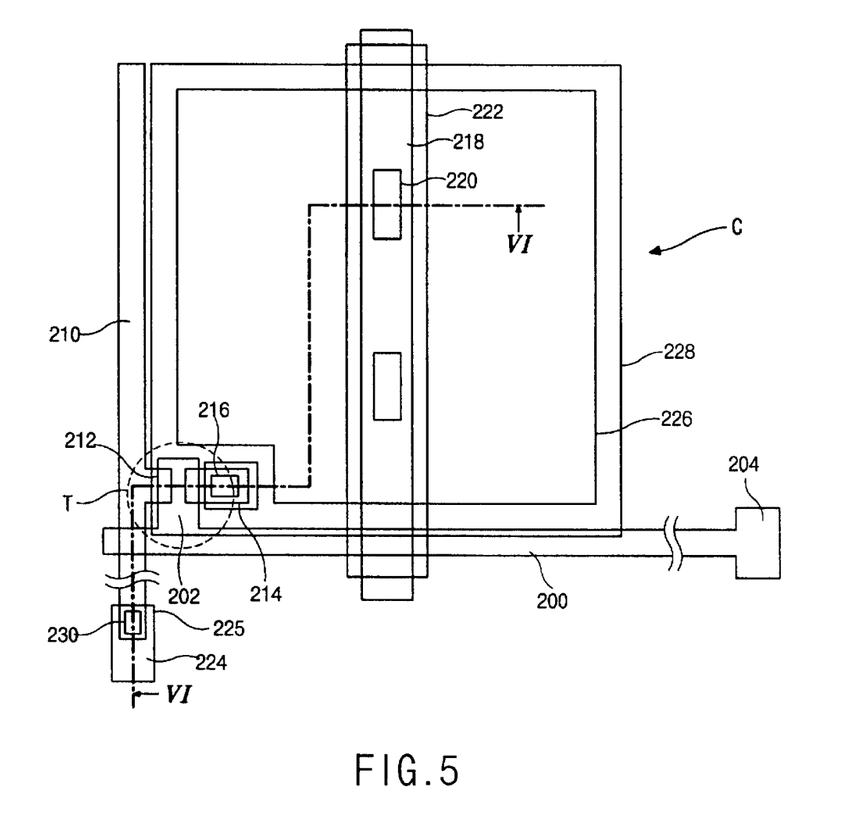
FIG. 5 a plan view illustrating one pixel of an X-ray image sensor according to a preferred embodiment of the present invention.

FIG. 5 is a plan view of an X-ray image sensor according to an embodiment of the present invention and is similar to the plan view of conventional X-ray image sensor (see FIG. 2).

Shown are a TFT "T", a storage capacitor "C," and gate and data lines 200 and 210. The gate line 200 is arranged in a transverse direction and the data line 210 is arranged perpendicular to the gate line 200. The TFT "T" is formed near the crossing of the gate and data lines 200 and 210. The TFT "T" includes a gate electrode 202, which is formed by an elongation of the gate line 200, and a source electrode 212, which is formed by an elongation of the data line 210. The TFT "T" also includes a drain electrode 214 that is spaced apart from the source electrode 212.

A ground line 218 is arranged parallel to the data line 210 and perpendicular to the gate line 200. The ground line 218 crosses the storage capacitor area and acts as a common electrode that is shared by adjacent pixels. A ground line contact hole 220 is formed over the ground line 218 such that a capacitor electrode 226 is connected to the ground line 218 through the ground line contact hole 220. Two or more two ground line contact holes can be formed over the ground line 218. An island-shaped semiconductor layer 222 is formed under the ground line 218.

The storage capacitor "C", which stores electric charges, is comprised of the capacitor electrode 226, a pixel electrode 228, and a dielectric layer (not shown) that is interposed between the capacitor electrode 226 and the pixel electrode 228. The pixel electrode 228 extends over the TFT "T" and acts as the other capacitor electrode. The pixel electrode 228 is electrically connected to the drain electrode 214 via a drain contact hole 216.

A gate pad 204 is formed at one end of the gate line 200, and a data pad 224 is formed at one end of the data line 210. The data pad 224 includes a data pad connector 225 that is connected to the data line 210 through the first data pad contact hole 230. Thus, the data line 210 is electrically connected to the data pad 224.

Figure 6A:
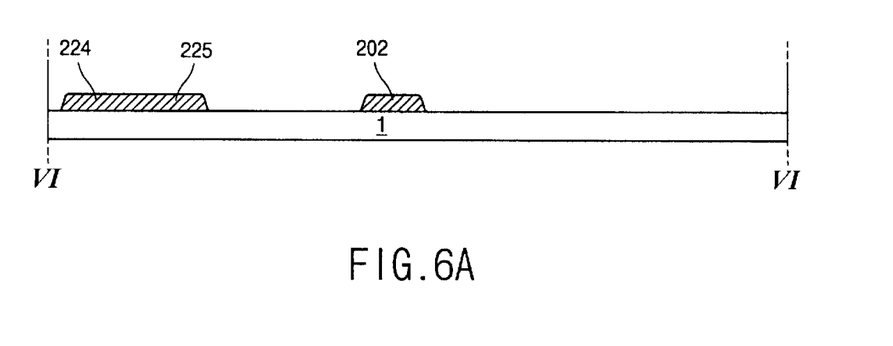
FIGS. 6A to 6C are processing diagrams corresponding to a cross-section of FIG. 5 along line (VI—VI) and sequentially illustrate the manufacture of an X-ray image sensor according to the preferred embodiment of the present invention.
Figure 6B:
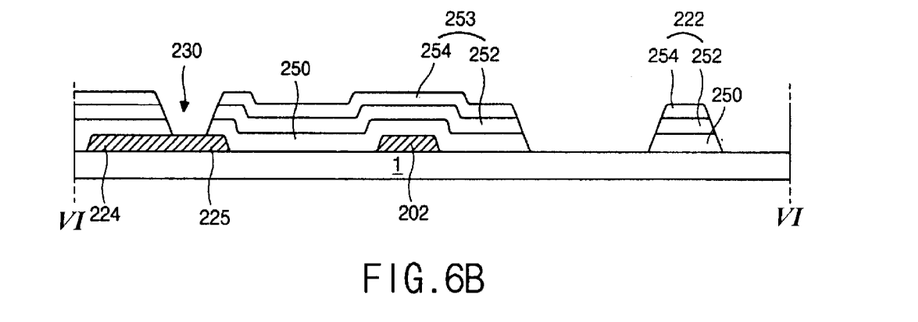
Figure 6C:
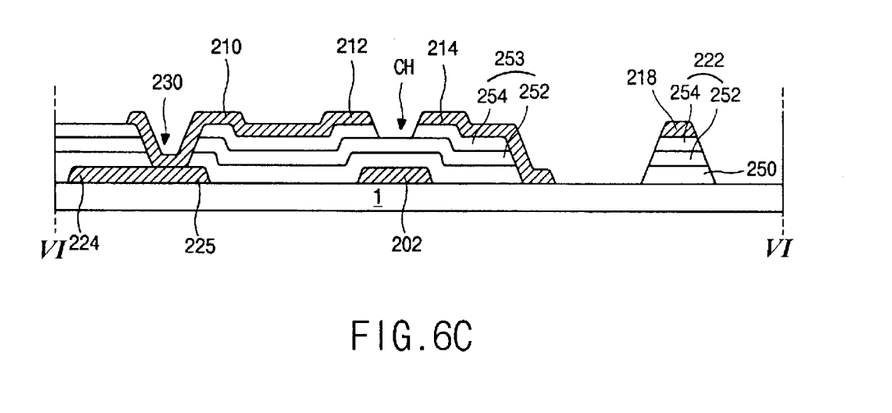

FIGS. 6A to 6C are cross-sectional views, taken along line VI—VI of FIG. 5, that illustrate manufacturing processes of a X-ray image sensor panel.

Referring to FIG. 6A, a gate electrode 202, a data pad 224, and a data pad connector 225 are formed on a substrate 1 by depositing and patterning a low resistant metallic material such as Aluminum (Al) or Al-alloy (for example, AlNd) using a first mask. As best shown in FIG. 5, the data pad connector 225 is extended from the data pad 224.

FIG. 6B shows a step of forming a first insulation layer 250 and semiconductor layers 253 and 222. A first insulation material 250, a pure amorphous silicon 252, and a doped amorphous silicon 254 are sequentially deposited over the substrate 1, over the gate electrode 202, over the data pad 224, and over the data pad connector 225. Then, the semiconductor layer 253 and an island-shaped semiconductor layer 222 are formed by patterning the first insulation layer 250, the pure amorphous silicon layer 252, and the doped amorphous silicon layer 254 using a second mask. The island-shaped semiconductor layer 222 is formed in order to prevent a ground line, which will be formed in a later step, from having an open circuit. Furthermore, the first data pad contact hole 230 is also formed using the second mask. As compared to the conventional method of fabricating an X-ray image sensor that uses an additional mask to form the first data pad contact hole, a mask process can be omitted.

Referring to FIG. 6C, a data line 210, a source electrode 212, a drain electrode 214, and a ground line 218 are formed by depositing and patterning a second metallic material using a third mask. At this time, the data line 210 is electrically connected to the data pad connector 225 through the first data pad contact hole 230. Moreover, a ground line 218 is formed on the island-shaped semiconductor layer 222, and a portion of the doped amorphous silicon layer 254 is etched to form a channel region "CH" using the source and drain electrodes 212 and 214 as masks. Thus, the TFT "T" (see FIG. 5) is completed. Since the subsequent manufacturing steps are the same as the conventional method described with the assistance of FIGS. 3D and 3E, a detailed explanation of the subsequent manufacturing steps are omitted.

As described above, since the X-ray image sensor of the present invention is fabricated using only eight-masks, the throughput and manufacturing yields increase, and the manufacturing costs and time are reduced. Moreover, misalignment defects resulting from the numerous mask processes are reduced.

Figure 7:
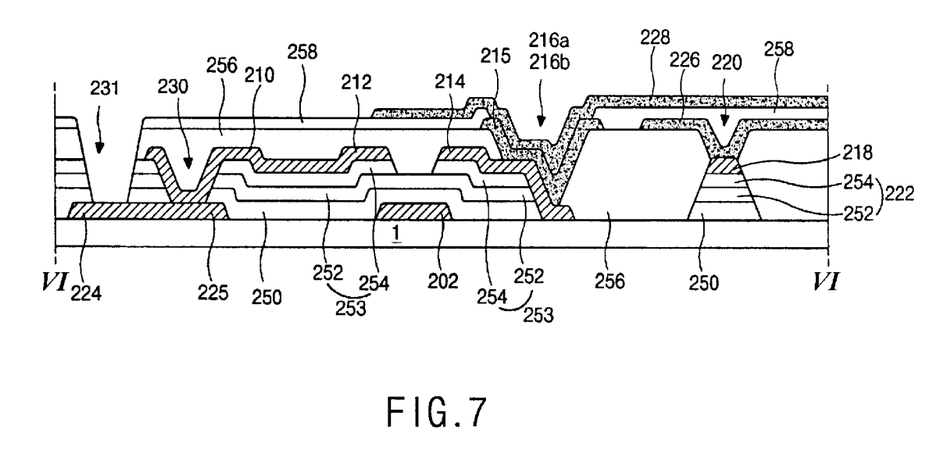
FIG. 7 is a cross-sectional view taken along line VI—VI of FIG. 5 and illustrates the X-ray image sensor fabricated according to the preferred embodiment of the present invention.

FIG. 7 is a completed cross-sectional view of an X-ray image sensor according to the principles of the present invention.

The data pad 224, the data pad connector 225, and the gate electrode 202 are formed on the substrate 1 by depositing and patterning the first metallic layer. Then, the first insulation layer 250, the pure amorphous silicon layer 252 and the doped amorphous silicon layer 254 are sequentially formed over the substrate 1 and over the first metallic layer. By patterning the first insulation layer 250, the pure amorphous silicon layer 252, and the doped amorphous silicon layer 254, the first drain contact hole 230, the semiconductor layer 253, and the island-shaped semiconductor layer 222 are formed.

After that, the source and drain electrodes 212 and 214 are formed on the semiconductor 253 by depositing and patterning the second metallic layer. The ground line 218 is simultaneously formed on the island-shaped semiconductor layer 222. At this time, the data line 210, which is formed while forming the source and drain electrodes 212 and 214, is connected to the data pad connector 225.

The second insulation layer 256 is formed on the second metallic layer and on the substrate 1. The first drain contact hole 216a and the ground line contact hole 220 are formed to expose a portion of the drain electrode 214 and a portion of the ground line 218, respectively, by patterning the second insulation layer 256.

After that, the auxiliary drain electrode 215, which contacts the drain electrode 214 through the first drain contact hole 216a, and the capacitor electrode 226, which contacts the ground line 218 through the ground line contact hole 220 are formed. The auxiliary drain electrode 215 and the capacitor electrode 226 are made of the transparent conductive material such as Indium-Tin-Oxide (ITO) or Indium-Zinc-Oxide (IZO). The auxiliary drain electrode 215 and the capacitor electrode 226 are spaced apart from each other. Moreover, the second insulation layer 256 is made of BCB (Benzocyclobutene), which has a good planarizing ratio and a low dielectric permittivity.

A third insulation layer 258 is formed on the second insulation layer 256, on the auxiliary drain electrode 215, and on the capacitor electrode 226. Then, a second drain contact hole 216b is formed to expose a portion of the auxiliary drain electrode 215 by patterning the third insulation layer 258.

A pixel electrode 228 is formed on the third insulation layer 258 by depositing and patterning the transparent conductive material. The pixel electrode 228 contacts the auxiliary drain electrode 215 through the second drain contact hole 216b. At this time, the third insulation layer 258 insulates the pixel electrode 228 from the capacitor electrode 226.

The second data pad contact hole 231 is formed to expose the portion of the data pad 224 by patterning the first, second, and third insulation layer 250, 256 and 258, and the pure and doped amorphous silicon layers 254 and 252.

Although not depicted in FIG. 7, the next step is the application of a photoconductive film. That material converts received external signals (X-rays) into electric charges. The photoconductive film is beneficially comprised of an amorphous selenium compound that is deposited in a thickness of 100 to 500 $\mu$m by an evaporator. However, other X-ray photoconductive films that having low dark conductivity and high sensitivity to external signals, for example $HgI_2$, $PbO_2$, CdTe, CdSe, Thallium bromide or Cadmium sulfide, can also be used. When the photoconductive film is exposed to X-rays, electron-hole pairs are produced in the photoconductive film in accordance with the strength of the X-rays.

After the application of the X-ray photoconductive film, a transparent conductive electrode that passes X-ray is formed. When a voltage is applied to the transparent conductive electrode while X-rays are being irradiated, electron-hole pairs formed in the photoconductive film are separated into charges that are gathered to the pixel electrode and stored in the storage capacitor "C" (see FIG. 5).

The operation of the X-ray image sensor of the present invention will be explained hereinafter.

The photoconductive film produces electron-hole pairs in proportion to the strength of external signals (such as incident electromagnetic waves or magnetic waves). Either the electrons or the holes are then gathered by the pixel electrode 228 as electric charges. Which electric charge that is gathered depends on the voltage (Ev) polarity that is applied to the conductive electrode by the high voltage D.C. power supply. The gathered electric charges are accumulated in the storage capacitor, which is formed in connection with a grounding line. By applying a signal to the gate electrode 202 of the TFT, i.e., the switching operation, charges in the storage capacitor "C" (see FIG. 5) are selectively transferred through the TFT to an external image display device that produces an X-ray image.

After removing the gate signal, residual charges are transferred to the ground line 218. Therefore, the ground line 218 acts as a reset switch.

The function of the individual element of the X-ray image sensor is as follows:

First, the photoconductive film and the transparent conductive electrode act as a photoelectric transducer that converts X-rays to electric signals.

Second, the storage capacitor acts as a means of storing the electric charges generated by the photoconductive film.

Third, the TFT acts as a switching element that selectively transfers electric charge to the external drive circuitry.

As described above, since the X-ray image sensor of the present invention is fabricated using only eight-masks, the throughput and manufacturing yields increase, and the manufacturing costs and time is reduced. Moreover, due to the eight-mask process, the mis-alignment defect caused by the numerous mask processes is reduced.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. An X-ray image sensor, comprising:
    a substrate having a pixel region and a switching region at one corner of the pixel region;
    a thin film transistor (TFT) formed in the switching region, the TFT having a gate electrode, a first insulation layer, a pure amorphous silicon layer, a doped amorphous silicon layer, and source and drain electrodes;
    an island-shaped first insulation layer and an island-shaped semiconductor layer formed in the pixel region;
    a ground line formed on the island-shaped semiconductor layer;
    a second insulation layer formed on the TFT, on the substrate; and on the ground line, the second insulation layer having a first drain contact hole which exposes a portion of the drain electrode, and a ground line contact hole which exposes a portion of the ground line;
    an auxiliary drain electrode formed on the second insulation layer and contacting the drain electrode through the first drain contact hole;
    a capacitor electrode formed on the second insulation layer and contacting the ground line through the ground line contact hole;
    a third insulation layer formed on the second insulation layer, on the auxiliary drain electrode and on the capacitor electrode, the third insulation layer having a second drain contact hole which exposes a portion of the auxiliary drain electrode; and
    a pixel electrode formed on the third insulation layer and contacting the auxiliary drain electrode through the second drain contact hole.

2. An X-ray image sensor according to claim 1, wherein the pixel electrode extends over the source and drain electrodes.

3. An X-ray image sensor according to claim 1, wherein the second insulation layer is made of BCB (benzocyclobutene).

4. An X-ray image sensor according to claim 1, wherein the auxiliary drain electrode and the capacitor electrode are made of a transparent conductive material.

5. A method for fabricating an X-ray image sensor, comprising: providing a substrate that has a pixel region with a switching region at one corner and portions for data and gate lines;
    forming a gate electrode, a data pad connector and a data pad on the substrate by depositing and patterning a first metallic material using a first mask process;
    sequentially forming a first insulation layer, a pure amorphous silicon layer and a doped amorphous silicon layer such that the first insulation layer covers the substrate, the gate electrode, the data pad connector, and the data pad;
    forming a first data pad contact hole, a semiconductor layer, and an island-shaped semiconductor layer by patterning the doped amorphous silicon layer, the pure amorphous silicon layers, and the first insulation layer using a second mask process, wherein a first data contact hole exposes a portion of the data pad connector;
    forming a data line, a source electrode, a drain electrode, and a ground line on the semiconductor layer and on the island-shaped semiconductor layer by depositing and patterning a second metallic material using a third mask process, wherein the data line contacts the data pad connector through the first data pad contact hole;
    forming a second insulation layer on the TFT, on the substrate, and on the ground line;
    forming a first drain contact hole and a ground line contact hole by patterning the second insulation layer using a fourth mask process, wherein a first drain contact hole exposes a portion of the drain electrode, and a ground line contact hole exposes a portion of the ground line;
    forming an auxiliary drain electrode and a capacitor electrode on the second insulation layer by depositing and patterning a transparent conductive material using a fifth mask process, wherein an auxiliary drain electrode contacts the drain electrode through the first drain contact hole, and wherein a capacitor electrode contacts the ground line through the ground line contact hole;
    forming the third insulation layer on the second insulation layer, on the auxiliary drain electrode, and on the capacitor electrode;

forming a second drain contact hole to expose a portion of the auxiliary drain electrode by patterning the third insulation layer using a sixth mask process;

forming a pixel electrode on the third insulation layer by depositing and patterning a transparent conductive material using a seventh mask process, wherein the pixel electrode contacts the auxiliary drain electrode through the second drain contact hole; and forming a second data pad contact hole to expose a portion of the data pad by patterning the first, second, and third insulation layers, and the pure and doped amorphous silicon layers.

6. A method for fabricating an X-ray image sensor according to claim 5, wherein the second insulation layer is formed from BCB (Benzocyclobutene).

7. A method for fabricating an X-ray image sensor according to claim 5, further comprising, forming a channel region by removing a portion of the doped amorphous silicon layer over the pure amorphous silicon layer using the source and drain electrodes as masks.

8. A method for fabricating an X-ray image sensor according to claim 5, wherein the auxiliary drain electrode, the capacitor electrode and the pixel electrode are formed from indium tin oxide (ITO).

9. A method for fabricating an X-ray image sensor according to claim 5, wherein the auxiliary drain electrode, the capacitor electrode and the pixel electrode are formed from indium zinc oxide (IZO).

10. A method for fabricating an X-ray image sensor according to claim 5, wherein the gate electrode, the data pad connector and the data pad are formed from a material selected from a group consisting of aluminum (Al) and aluminum-neodymium (AlNd).

* * * * *